United States Patent
Katakura

(10) Patent No.: US 9,412,694 B2
(45) Date of Patent: Aug. 9, 2016

(54) POLYSILICON FUSE, MANUFACTURING METHOD THEREOF, AND SEMICONDUCTOR DEVICE INCLUDING POLYSILICON FUSE

(71) Applicant: FUJI ELECTRIC CO., LTD., Kawasaki-shi (JP)

(72) Inventor: Hideaki Katakura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/278,077

(22) Filed: May 15, 2014

(65) Prior Publication Data

US 2014/0339675 A1      Nov. 20, 2014

(30) Foreign Application Priority Data

May 17, 2013   (JP) .................. 2013-105224

(51) Int. Cl.
  *H01L 23/52*     (2006.01)
  *H01L 23/525*    (2006.01)
  *H01L 21/768*    (2006.01)

(52) U.S. Cl.
  CPC .......... *H01L 23/5256* (2013.01); *H01L 21/768* (2013.01); *H01L 21/76804* (2013.01); *H01L 23/525* (2013.01); *H01L 2924/0002* (2013.01)

(58) Field of Classification Search
None
See application file for complete search history.

(56) References Cited

U.S. PATENT DOCUMENTS

| 2007/0262414 | A1 | 11/2007 | Ueda |
| 2009/0261450 | A1* | 10/2009 | Cheng et al. .................. 257/529 |

FOREIGN PATENT DOCUMENTS

| JP | 2004335608 A | 11/2004 |
| JP | 2006041257 A | 2/2006 |
| JP | 2007305693 A | 11/2007 |
| JP | 2012039046 A | 2/2012 |

* cited by examiner

*Primary Examiner* — Fei Fei Yeung Lopez
(74) *Attorney, Agent, or Firm* — Rossi, Kimms & McDowell LLP

(57) ABSTRACT

A polysilicon fuse is disclosed that is capable of securing good insulation after being cut into small areas. A manufacturing method for the fuse and a small-size and highly-reliable semiconductor device including a polysilicon fuse also are disclosed. By forming a cavity inside a polysilicon portion serving as a melting portion by setting the melting portion of the polysilicon fuse to be a vertical type, a gap is formed between an upper part electrode and the surface of melted polysilicon when the polysilicon fuse is cut off. Because of this gap, good insulation can be secured. By using this polysilicon fuse, a semiconductor device that has a small size and high reliability is provided.

10 Claims, 9 Drawing Sheets

POLYSILICON FUSE, MANUFACTURING METHOD THEREOF, AND SEMICONDUCTOR DEVICE INCLUDING POLYSILICON FUSE

BACKGROUND OF THE INVENTION

A. Field of the Invention

The present invention relates to a polysilicon fuse used for trimming a semiconductor circuit, a manufacturing method thereof, and a semiconductor device including a polysilicon fuse.

B. Description of the Related Art

In order to adjust a resistance value and the like of a semiconductor circuit, a polysilicon fuse is used as a trimming device. The polysilicon fuse can be cut off by performing laser emission or voltage application. The cutting-off method using the voltage application has a particular advantage of being capable of performing adjustment together with a wafer test after the completion of the process.

FIG. 8 is a diagram that illustrates a main portion of a circuit of which the resistance is adjusted by a polysilicon fuse 500. In a case where the polysilicon fuse 500 is used for the adjustment of a resistance value or the like of a semiconductor circuit, a plurality of resistors, for example, resistors R51 to R54 are formed in advance, and the polysilicon fuse 500 is cut off.

FIGS. 9A and 9B are configuration diagrams of a conventional lateral-type polysilicon fuse 500. FIG. 9A is a plan view of a main portion thereof, and FIG. 9B is a cross-sectional view of the main portion taken along line X-X illustrated in FIG. 9A. A polysilicon film is formed on an insulating film 502 that is formed on a semiconductor substrate 501 and is patterned, whereby the polysilicon fuse 500 is formed. This polysilicon fuse 500 is a lateral-type fuse and is configured by left and right electrode portions 503 and 504 formed using polysilicon and a polysilicon portion 505 that serves as a melting portion. By causing a large current to flow through this polysilicon fuse 500, the polysilicon portion 505 serving as the melting portion is melted, and, when the melted polysilicon portion is solidified, a gap is formed (finely divided) between the solidified polysilicon portions, and the solidified polysilicon portions are electrically insulated from each other.

When the polysilicon portion is melted, in a case where the melted polysilicon is scattered around, there is a possibility that a peripheral circuit arranged on the periphery of the polysilicon fuse 500 and a device configured thereby may be damaged.

In order to suppress the scattering of polysilicon, it is preferable that a voltage applied to the polysilicon fuse 500 be low. When the applied voltage is high, the melted polysilicon is scattered much more due to a large arc current at the time of cutting off the polysilicon fuse. On the other hand, when the applied voltage is low, the melted polysilicon is scattered less, but a case may occur in which the melted polysilicon is not melted down. Next, a method for stably cutting off the polysilicon fuse even in a case where the applied voltage is low will be described.

In Japanese Patent Application Laid-Open (JP-A) No. 2004-335608, it is disclosed that a resistance value of the polysilicon portion is partially changed, and a place at which the fuse is melted is limited for stably cutting off a polysilicon fuse.

In JP-A No. 2006-41257, it is disclosed that a cavity is formed near a polysilicon fuse, and, when the polysilicon fuse is cut off, scattered polysilicon is absorbed in the cavity.

In JP-A No. 2012-39046, it is disclosed that a contact hole formed in an interlayer insulating film is used as a via-cutting-type electrical fuse. This via-cutting-type electrical fuse is a vertical-type fuse and is formed using a copper wire.

In JP-A No. 2007-305693, it is disclosed that an upper layer metal wiring and a lower layer metal wiring are connected by filling a metal member having copper as its main composition in a via formed in an interlayer insulating film, and the metal member filled in the via is used as a vertical-type fuse.

However, the polysilicon fuse 500 illustrated in FIGS. 9A and 9B and the polysilicon fuses illustrated in JP-A Nos. 2004-335608 and 2006-41257 are lateral-type fuses allowing a current to flow in the lateral direction, and accordingly, the occupied areas thereof are large.

In addition, in a case where a circuit element is arranged near the polysilicon fuse 500 so as to decrease chip size, cutting-off is performed with a low in order to decrease the scattering of melted polysilicon.

When the polysilicon fuse 500 is melted down with a low voltage, polysilicon is finely divided to be in an insulated state. However, there are cases where the polysilicon, which has been finely divided to be in the insulated state, is connected together during actual operation of the semiconductor device so as to form a leakage path, and defective insulation occurs. As a result, there is a problem that a characteristic value of the semiconductor device changes.

In addition, the above-described fuses disclosed in JP-A Nos. 2012-39046 and 2007-305693 are formed using metal, and there is no description of a polysilicon fuse. An object of the present invention is to solve the above-described problems and to provide a polysilicon fuse capable of securing good insulation after being cut into small areas, a manufacturing method thereof, and a small-size and highly-reliable semiconductor device including a polysilicon fuse.

SUMMARY OF THE INVENTION

According to a first aspect of the present invention, there is provided a polysilicon fuse including: a lower part electrode; an interlayer insulating film that is arranged on the lower part electrode; an opening portion that is arranged in the interlayer insulating film and reaches the lower part electrode; a polysilicon portion, which serves as a melting portion, that is arranged inside the opening portion and includes a cavity; and an upper part electrode that is arranged on the interlayer insulating film so as to be brought into contact with the polysilicon portion.

According to a second aspect of the present invention, in the invention according to the first aspect, the opening portion may include an area having a reversely tapered shape in which an opening area increases as the depth increases. In addition, according to a third aspect of the present invention, in the invention according to the first or second aspect, the lower part electrode may be formed by using a polysilicon film, and the upper part electrode may be formed by using a metal film.

According to a fourth aspect of the present invention, in the invention according to any one of the first to third aspects, the lower part electrode may be a part of a lower layer wiring, and the upper part electrode may be a part of an upper layer wiring.

According to a fifth aspect of the present invention, in the invention according to any one of the first to fourth aspects, when the melting portion is melted, a gap may be formed between an upper face of the melted polysilicon and the upper part electrode, and the upper part electrode and the lower part electrode may be electrically insulated from each other.

According to a sixth aspect of the present invention, in the invention according to any one of the first to fourth aspects, the interlayer insulating film may be formed as being at least two layers or more, and an etching rate of an upper layer of the two layers may be lower than an etching rate of a lower layer.

In addition, according to a seventh aspect of the present invention, there is provided a method of manufacturing the polysilicon fuse according to any one of the first to sixth aspects. The method includes: forming a lower part electrode formed using a first polysilicon film by forming a polysilicon film on an insulating film and patterning the polysilicon film; forming an interlayer insulating film on the lower part electrode and the insulating film that is disposed on the periphery of the lower part electrode; forming an opening portion that reaches the lower part electrode above the lower part electrode of the interlayer insulating film; forming a second polysilicon film of a melting portion by depositing polysilicon into the opening portion so as to occupy an upper portion of the opening portion, forming a cavity inside the polysilicon film, and removing the polysilicon film until the interlayer insulating film is exposed; and forming an upper part electrode that is a metal film on the interlayer insulating film so as to be brought into contact with the second polysilicon film filling the opening portion.

According to an eighth aspect of the present invention, in the invention according to the seventh aspect, a side wall of the opening portion of the interlayer insulating film may be formed in a reversely tapered shape. In addition, according to a ninth aspect of the present invention, in the invention according to the seventh or eighth aspect, a side wall of the opening portion having a reversely tapered shape may be formed by arranging an insulating film of which the etching rate is low is arranged in an upper layer, and an insulating film of which the etching rate is high may be arranged in a lower layer in the interlayer insulating film.

In addition, according to a tenth aspect of the present invention, there is provided a semiconductor device including the polysilicon fuse according to any one of the first to sixth aspects.

According to the present invention, the area can be formed to be small by configuring a melting portion of a polysilicon fuse to be the vertical type. In addition, by forming a cavity inside the melting portion, a gap is formed between an upper part electrode and the surface of the melted polysilicon when the polysilicon fuse is cut off. According to this gap, good insulation can be secured.

By using this polysilicon fuse, a small-size semiconductor device having high reliability can be provided.

BRIEF DESCRIPTION OF THE DRAWINGS

The foregoing advantages and features of the invention will become apparent upon reference to the following detailed description and the accompanying drawings, of which:

FIG. 1A is a plan view of a main portion thereof, and FIG. 1B is a cross-sectional view of the main portion taken along line X-X illustrated in FIG. 1A;

FIG. 4A is a diagram that illustrates a case where the side wall is formed to have a two-layer structure, and FIG. 4B is a diagram that illustrates a case where the side wall is formed using RIE obliquely emitting ions;

FIG. 9A is a plan view of a main portion thereof, and FIG. 9B is a cross-sectional view of the main portion taken along line X-X illustrated in FIG. 9A.

DETAILED DESCRIPTION OF SPECIFIC EMBODIMENTS

Embodiments will be described in the following examples.

EXAMPLE 1

Figure 1A:
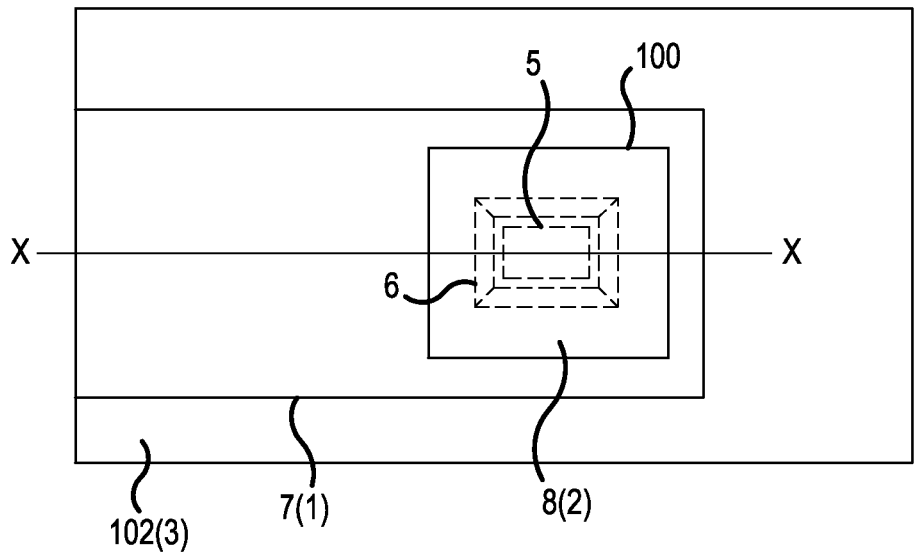
FIGS. 1A and 1B are diagrams that illustrate the configuration of a polysilicon fuse according to a first example of the present invention.
Figure 1B:
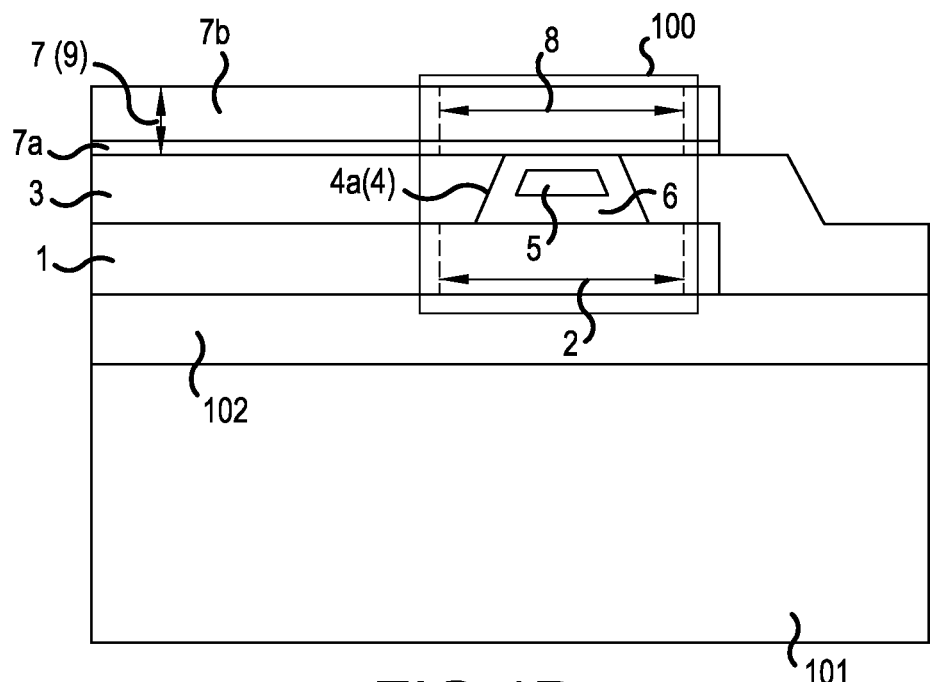

FIGS. 1A and 1B are diagrams that illustrate the configuration of a polysilicon fuse according to a first example of the present invention. FIG. 1A is a plan view of a main portion thereof, and FIG. 1B is a cross-sectional view of the main portion taken along line X-X illustrated in FIG. 1A. As illustrated in FIGS. 1A and 1B, the polysilicon fuse 100 is arranged on an insulating film 102 such as LOCOS arranged on a semiconductor substrate 101.

This polysilicon fuse 100 is equipped with: a lower part electrode 2 that is a part of a lower layer wiring 1; an interlayer insulating film 3 that is arranged on the lower layer wiring 1 and an insulating film 102 disposed on the periphery thereof; an opening portion 4 that is arranged on the interlayer insulating film 3 disposed right above the lower part electrode 2 and has a narrower upper portion; a polysilicon portion 6 that fills this opening portion 4, has a cavity 5 therein, and serves as a melting portion; and an upper part electrode 8 that is a part of an upper layer wiring 7 arranged on the interlayer insulating film 3 and the polysilicon portion 6 serving as the melting portion. The lower part electrode 2 is formed using a polysilicon film, and the upper part electrode 8 is formed by arranging a barrier metal 7a on the polysilicon portion 6 serving as the melting portion and arranging a wiring metal 7b thereon. In addition, the upper part electrode 8 is arranged so as to cover the opening portion 4.

The polysilicon portion 6 serving as the melting portion has a cross-sectional shape in which the upper portion is narrow, and the lower portion is wide, and the planar shape thereof is a rectangle. However, the planar shape is not limited thereto but may be a circle, a polygon, or the like. The above-described opening portion 4 can be formed by configuring a multi-layer structure in which an insulating film having a high etching rate is stacked in the lower layer, and an insulating layer having a low etching rate is stacked in the upper layer.

Since the size of the upper face of the polysilicon portion 6 serving as the melting portion is smaller than that of the lower face thereof, the upper part electrode 8 can be formed to be smaller than the lower part electrode 2. The occupied area of the upper part electrode 8 and the polysilicon portion 6, which serves as the melting portion, of the vertical-type polysilicon fuse 100 is included in the occupied area of the lower part electrode 2 and accordingly, can be formed to be a half or less of the occupied area of the lateral-type polysilicon fuse.

In addition, by forming the cavity 5 inside the polysilicon portion 6 serving as the melting portion, the melted polysilicon enters the cavity 5 and flows to the lower part electrode 2 side. As the melted polysilicon flows to the lower part electrode 2 side, a gap can be formed between the surface of the melted polysilicon and the upper part electrode 8. According to this gap, the polysilicon fuse 100 can reliably secure an insulated state.

Even in a case where the polysilicon fuse 100 is melted down with a low voltage, a leakage path that is formed in accordance with the migration occurring during an actual operation of the semiconductor device is reliably cut off in accordance with the above-described gap. Accordingly, the insulated state of the polysilicon fuse 100 is secured with high reliability.

Figure 2:
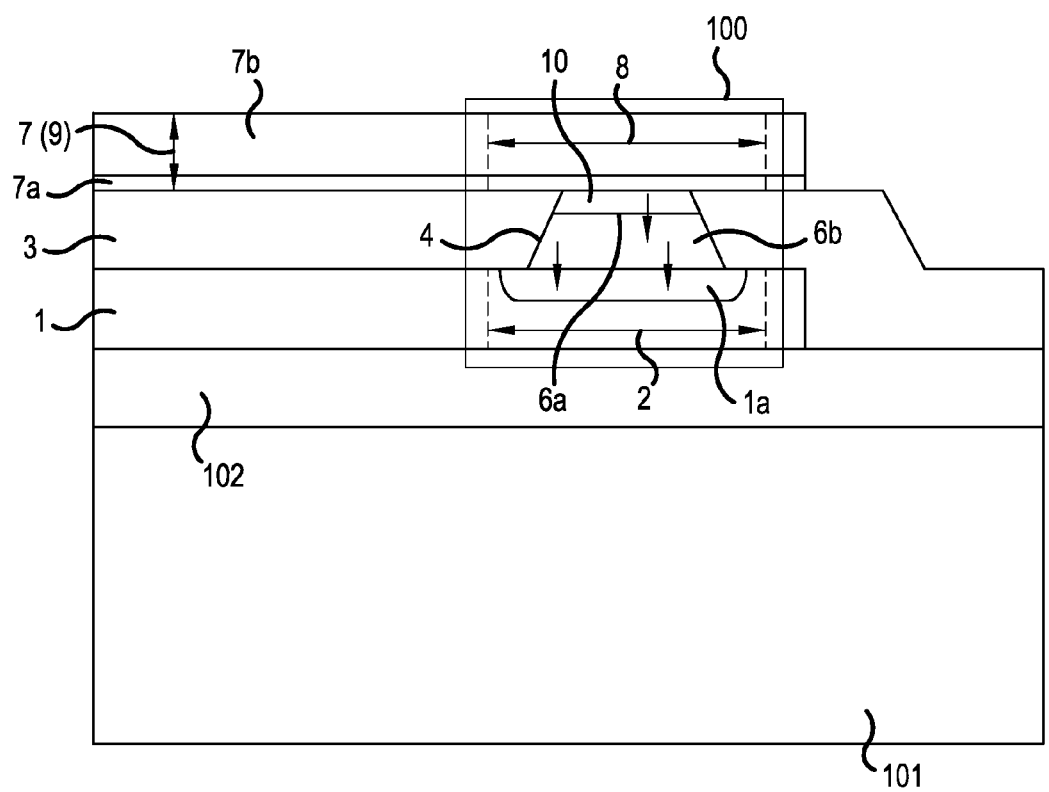
FIG. 2 is a diagram that illustrates the appearance of forming a gap between an upper part electrode and the surface of melted polysilicon.

FIG. 2 is a diagram that illustrates the appearance of forming the gap 10 between the upper part electrode 8 and the surface 6a of melted polysilicon. In a case where the polysilicon portion 6 serving as the melting portion is melted, the melted polysilicon 6b enters the cavity 5, whereby the cavity 5 disappears. At this time, polysilicon 1a of the lower part electrode 2 is also melted and draws in the melted polysilicon 6b of the upper part. Accordingly, the gap 10 is formed between the upper part electrode 8 and the surface 6a of the melted polysilicon.

The shape of the transverse section of the side wall 4a of the opening portion 4 is a reversely tapered shape in which the opening area (the area of the vertical cross-section) of the lower portion is larger than that of the upper portion. Accordingly, when the polysilicon portion 6 is formed through deposition, the cavity 5 can be formed with a high degree of controllability. The polysilicon portion 6 may be formed such that the cavity 5 is formed, and the shape of the transverse cross-section of the side wall 4a of the opening portion 4 may be a reversely tapered shape in which a part thereof has a reversely tapered shape in the depth direction.

Figure 5:
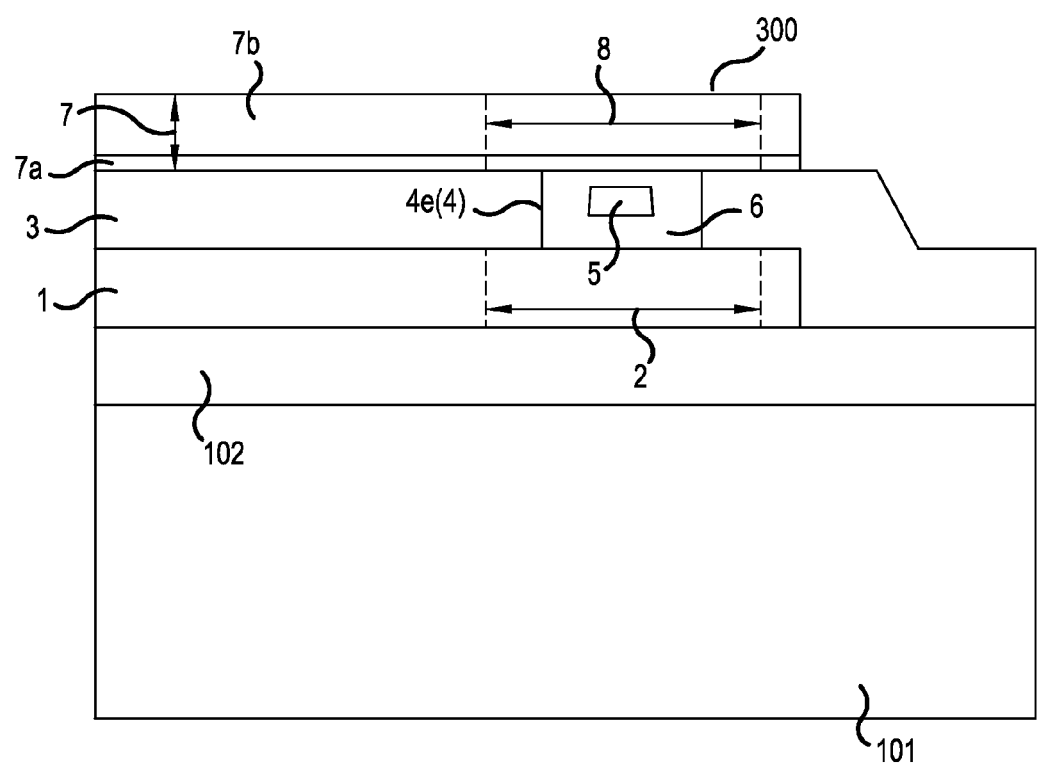
FIG. 5 is a cross-sectional view of the main portion that illustrates a modified example of the polysilicon fuse according to the first example of the present invention.

FIG. 5 is a cross-sectional view of the main portion of the polysilicon fuse 300 that illustrates a modified example of the polysilicon fuse according to the first example of the present invention. A difference from the configuration illustrated in FIG. 1B is that the shape of the transverse section of the side wall 4a of the opening portion 4 is not the reversely tapered shape, but the opening portion 4 having a side wall 4e perpendicular to the lower part electrode 2 is formed, and the other configurations are the same as those illustrated in FIGS. 1A and 1B. By employing such a configuration, a polysilicon portion 6 that includes the cavity 5 can be formed.

In a case where the lower part electrode 2 is formed by using polysilicon, when the polysilicon portion 6 of the lower part electrode 2 is melted, the lower part electrode 2 absorbs a part of the melted polysilicon portion 6. Accordingly, by forming the lower part electrode using polysilicon, the reliability of meltdown of the polysilicon fuse is further improved. The upper face of the lower part electrode 2 at this time can be formed to have an area that is about twice the area of the lower face of the polysilicon portion 6.

EXAMPLE 2

FIGS. 3A to 3D illustrate a method of manufacturing a polysilicon fuse according to a second example of the present invention and are cross-sectional views of the main portion represented in the processing order. These illustrate the method of manufacturing the polysilicon fuse illustrated in FIGS. 1A and 1B.

Figure 3A:
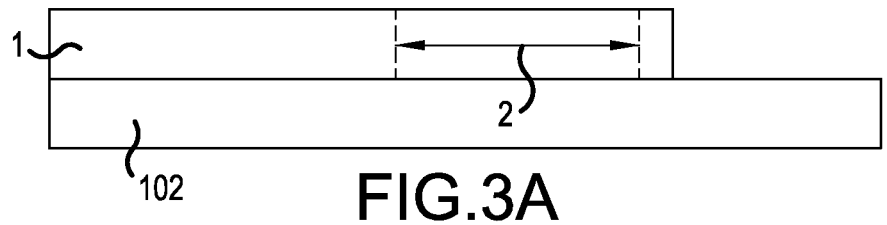
FIGS. 3A to 3D illustrate a method of manufacturing a polysilicon fuse according to a second example of the present invention and are cross-sectional views of the main portion represented in the processing order.

As illustrated in FIG. 3A, in the entire area positioned on the insulating film 102 such as LOCOS, a polysilicon film is formed using a CVD (Chemical Vapor Deposition) method under the conditions represented in Table 1, and the lower layer wiring 1 including the lower part electrode 2 is formed through a patterning process.

Figure 3B:
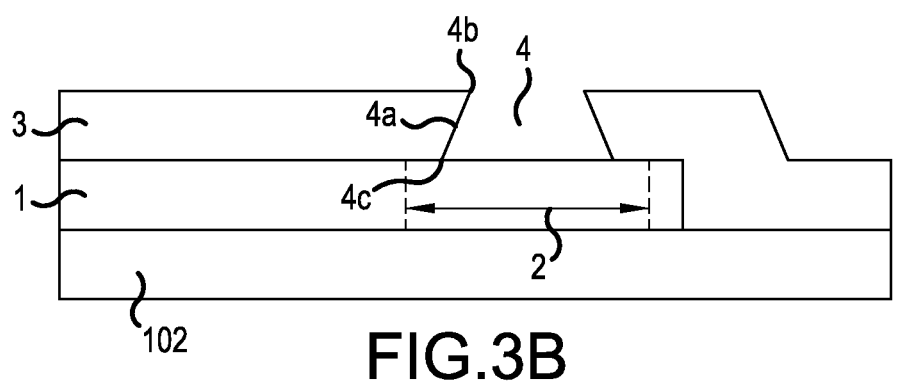

As illustrated in FIG. 3B, by forming the interlayer insulating film 3 on the lower layer wiring 1 and the insulating film 102 disposed on the periphery thereof as a film, the opening portion 4 is formed. The interlayer insulating film 3 is a two-layer insulating film that is formed under the conditions represented in Table 1. The opening portion 4 is arranged on the lower part electrode 2. The side wall 4a of the opening portion 4 of the interlayer insulating film 3 has a reversely tapered shape that has the narrow upper portion 4b and is broadened toward the lower portion 4c.

Figure 3C:
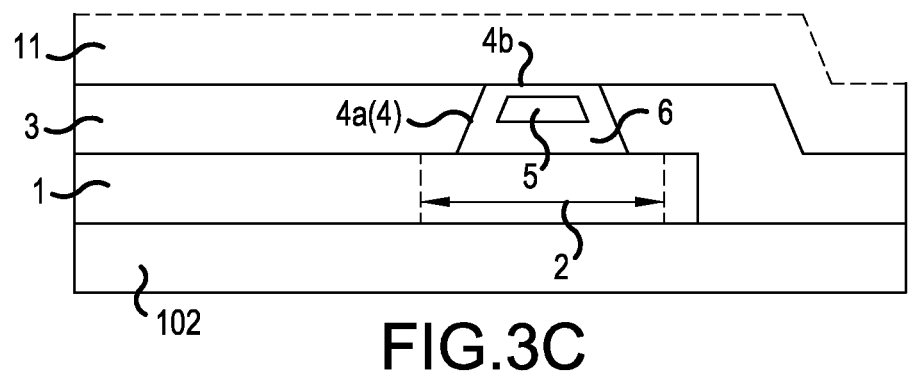

As illustrated in FIG. 3C, a polysilicon 11 is deposited under the film formation conditions of the polysilicon represented in Table 1 including the opening portion 4 of the interlayer insulating film 3. By depositing the polysilicon 11, the side wall 4a of the opening portion 4 is coated with the polysilicon 11 and closes the upper portion 4b of the opening portion 4, whereby the cavity 5 is formed inside the polysilicon 11. Subsequently, the polysilicon 11 disposed on the interlayer insulating film 3 is removed, whereby the upper face of the interlayer insulating film 3 and the upper face of the polysilicon portion 6 that includes the cavity 5 filling the opening portion 4 and serves as the melting portion are formed as one face. This is performed through an etching process using the interlayer insulating film 3 as a stopper layer. Residual polysilicon 11 disposed on the upper face is removed through this etching process.

Figure 3D:
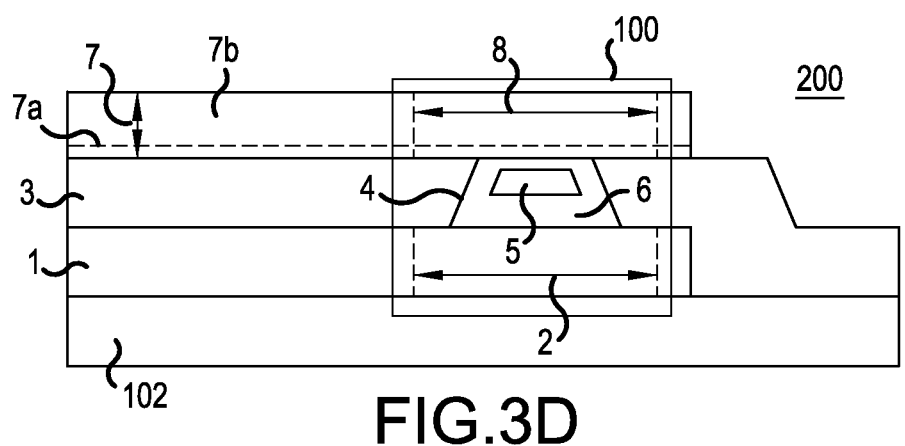

As illustrated in FIG. 3D, the wiring metal 7b such as aluminum is formed on the upper face through the barrier metal 7a such as TiN (titanium-nickel), whereby the upper layer wiring 7 including the upper part electrode 8 is formed. This barrier metal 7a serves to prevent the aluminum that is the wiring metal 7b from penetrating into the polysilicon portion 6 serving as the melting portion and serves to prevent the polysilicon portion 6 serving as the melting portion from entering the aluminum of the wiring metal 7b when the polysilicon portion 6 is melted. The upper layer wiring 7 including the upper part electrode 8 is configured by the barrier metal 7a and the wiring metal 7b.

Figure 4A:
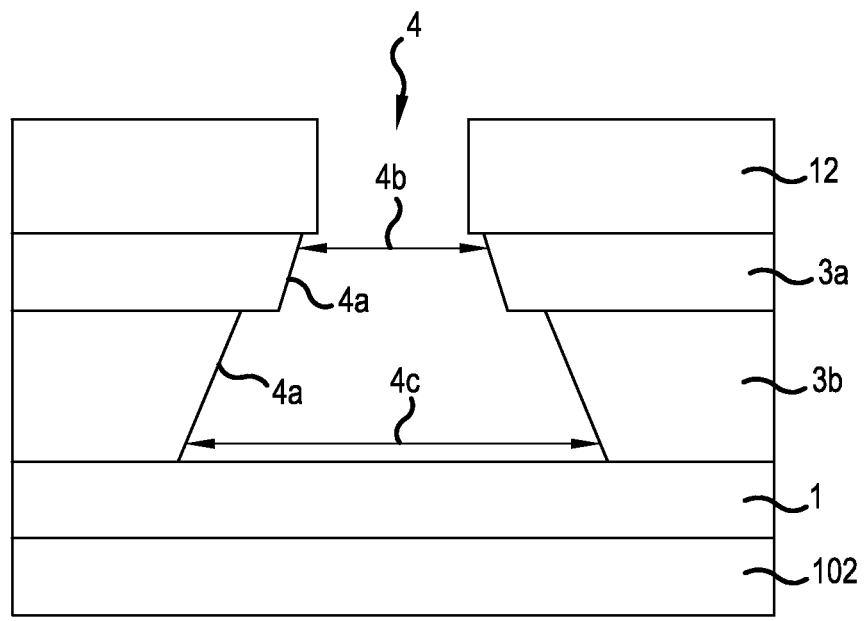
FIGS. 4A and 4B are diagrams that illustrate a method of forming the side wall of an interlayer insulating film in a reversely tapered shape.
Figure 4B:
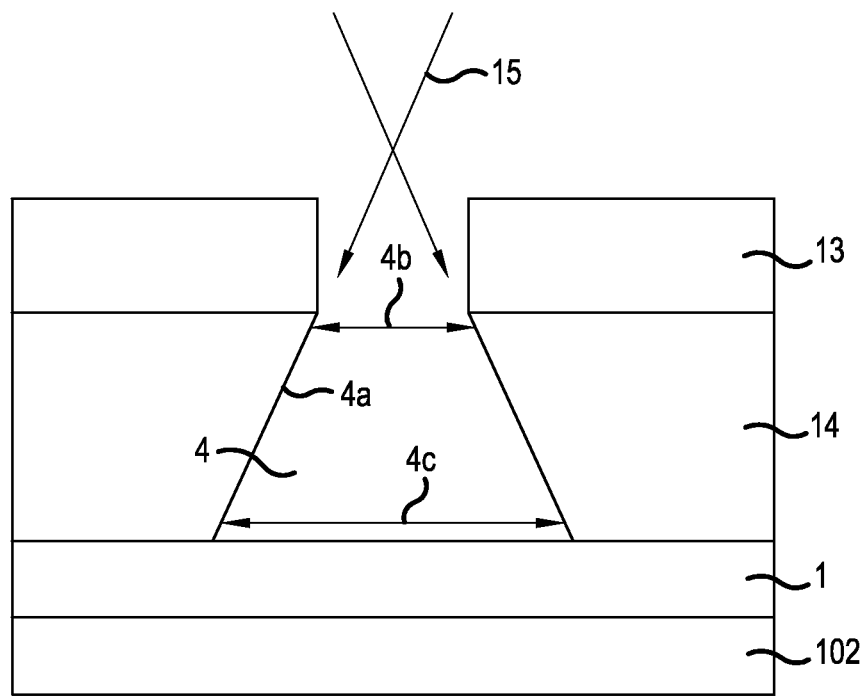

FIGS. 4A and 4B are diagrams that illustrate a method of forming the side wall 4a of the opening portion 4 of the interlayer insulating film 3 in a reversely tapered shape. FIG. 4A is a diagram that illustrates a case where the side wall is formed to have a two-layer structure, and FIG. 4B is a diagram that illustrates a case where the side wall is formed using RIE (Reactive Ion Etching) obliquely emitting ions.

In the case illustrated in FIG. 4A, the interlayer insulating film 3 is configured to have a two-layer structure by changing the properties of the films in which the insulating film 3a having a low etching rate is arranged in the upper layer, and the insulating film 3b having a high etching rate is arranged in the lower layer. By setting the film formation conditions as represented in Table 1 presented below, the insulating film 3a is formed to have a thickness of 0.3 µm, and the insulating film 3b is formed to have a thickness of 0.7 µm. As above, in a case where the interlayer insulating film 3 is formed as two layers, by forming the insulating film 3a of the upper layer to be thinner than the insulating film 3b of the lower layer, the volume of the cavity 5 can be formed to be large.

On the insulating films 3a and 3b, a resist mask 12 is formed by patterning, and etching is performed through isotropy plasma etching with the resist mask 12 used as a mask. Since the property of the insulating film 3a is finer than that of the insulating film 3b, the side wall 4a of the opening portion 4 can be formed in the reversely tapered shape (a shape expanding toward the lower portion in a stepped pattern) that has the narrow upper portion 4b and is broadened toward the lower portion 4c.

Although the example of a two-layer structure has been illustrated, the structure in not limited thereto, but a tapered shape may be formed by further increasing the number of layers. In the case illustrated in FIG. 4B, as the interlayer insulating film 14, for example, the interlayer insulating film 14 of a single layer formed under the film formation conditions of the upper layer represented in Table 1 is formed.

By performing RIE while changing the slope of the stage (which is not illustrated in the figure) and mounting the semiconductor substrate 101 thereon, ions 15 can be emitted to the interlayer insulating film 14 through a resist mask 13 obliquely, as a method of forming the opening portion 4. As the RIE, the following method is preferable.

First, a shield box in which a window formed from a lattice made using stainless steel is provided on the upper face is arranged between electrodes used for applying a voltage to plasma, and the semiconductor substrate 101 is arranged inside the shield box. Then, the plasma etching is performed while changing the slope of the semiconductor substrate 101 with respect to the acceleration direction of the ions. Alternatively, a lattice electrode used for applying a bias voltage is arranged between the plasma and the semiconductor substrate. The plasma etching is performed while changing the slope of the semiconductor substrate 101 with respect to the direction of the ions accelerated in accordance with the bias voltage.

Accordingly, the side wall 4a of the opening portion 4 can be formed in a reversely tapered shape that has the narrow upper portion 4b and is broadened toward the lower portion 4c. It is apparent that, the interlayer insulating film 14 may be an interlayer insulating film formed by a plurality of layers having mutually different film properties.

Instead of the RIE, the etching process may be performed through gas cluster etching. More specifically, there is the following method. ClF$_3$ gas is thermally expanded by blowing ClF$_3$ (chlorine trifluoride) from a nozzle into the inside of a vacuum chamber, whereby a cluster (a mass of several hundreds of molecules to several tens of thousands of molecules) of molecules called a gas cluster is formed. Then, this cluster is caused to collide with the semiconductor substrate, whereby etching is performed.

The film formation conditions of the interlayer insulating film 3 including the polysilicon portion 6 serving as the above-described melting portion and the opening portion 4 having a reversely tapered shape are represented in Table 1.

TABLE 1

| Film Type | | Film Formation Method | Gas Type | Temperature | Pressure |
|---|---|---|---|---|---|
| Polysilicon | | Low-Pressure CVD | SiH$_4$, PH$_3$ | 600° C. | 100 Pa |
| Interlayer Insulating Film | Upper Layer | Low-Pressure CVD | SiH$_2$Cl$_2$, NH$_3$ | 800° C. | 20 Pa |
| | Lower Layer | Low-Pressure CVD | SiH$_2$Cl$_2$, NH$_3$ | 500° C. | 200 Pa |

In the interlayer insulating film, an insulating film of the upper layer having high temperature and low pressure (the degree of vacuum is high) has a finer film quality so as to lower the etching rate.

As represented in Table 1, by performing film formation under conditions of high temperature and low pressure, the film property of the upper layer is fine. Accordingly, the interlayer insulating film 3 formed by a plurality of layers having mutually different etching rates can be formed.

As represented in Table 1, the formation of both films is performed using a low pressure CVD method. In addition, the polysilicon portion 6 serving as the melting portion is formed as a film by using the low pressure CVD method. When the polysilicon fuse 100 is cut off, the melted polysilicon 6b flows to the lower part electrode 2 side, whereby the gap 10 is formed between the upper part electrode 8 and the melted polysilicon 6b. According to this gap 10, the polysilicon fuse 100 can reliably secure the insulated state.

As a result, during an actual operation of the semiconductor device, degradation of the insulation according to the migration does not occur, and accordingly, the polysilicon fuse 100 can secure a high insulating property.

EXAMPLE 3

Figure 6:
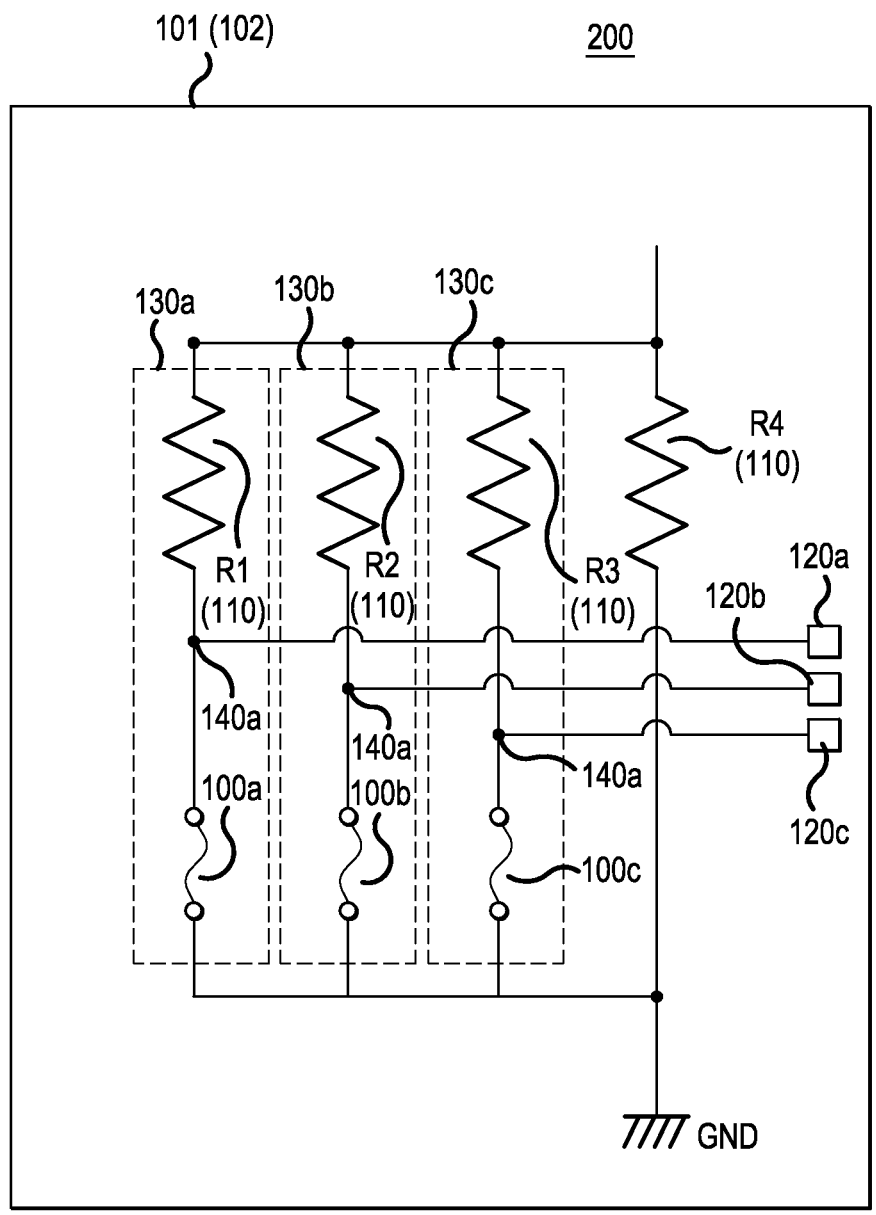
FIG. 6 is a diagram that illustrates the configuration of a main portion of a semiconductor device according to a third example of the present invention.

FIG. 6 is a diagram that illustrates the configuration of a main portion of a semiconductor device 200 according to a third example of the present invention. This configuration diagram is a diagram that illustrates an example of the polysilicon fuse 100 and a resistor group 110 that is a part of the peripheral circuit thereof.

Various integrated circuits not illustrated in the figure are formed on the semiconductor substrate 101, and, on the insulating film 102, such as a LOCOS arranged on this semiconductor substrate 101, resistors R1 to R4 configuring the resistor group 110, polysilicon fuses 100a to 100c, and pads 120a to 120c are formed.

Three series circuits 130a to 130c acquired by respectively connecting the polysilicon fuses 100a to 100c to the three resistors R1 to R3 in series and the resistor R4 to which the polysilicon fuse 100 is not connected are connected in parallel. To connection points 140a to 140c of the resistors R1 to R3 and the polysilicon fuses 100a to 100c, the pads 120a to 120c used for applying voltages for meltdown are connected.

Trimming is performed as follows. In a case where a characteristic value deviates from a target at the time of checking the characteristic in the final step of the wafer processing, for example, the polysilicon fuse 100a is cut off so as to acquire an appropriate resistance value. This cutting off is performed by applying a voltage to the polysilicon fuse 100a through the pad 120a and allowing a current to flow through the polysilicon portion 6 serving as the melting portion so as to melt the polysilicon portion 6 using Joule heat. As described above, the melted polysilicon 6b fills in the cavity 5 arranged inside the polysilicon and flows to the lower part electrode 2 side, whereby the gap 10 is generated between the upper part electrode 8 and the polysilicon 6b. According to this gap 10, during an actual operation of the semiconductor device 200, a leakage path according to the migration of the polysilicon is cut off, whereby good insulation can be secured. As a result, the semiconductor device 200 can be configured to be small and have high reliability.

While a case has been described in FIG. 6 in which the resistance value is adjusted, the present invention is not limited thereto. In order to select an optimal MOSFET, for example, the polysilicon fuse according to the present invention may be used.

Figure 7:
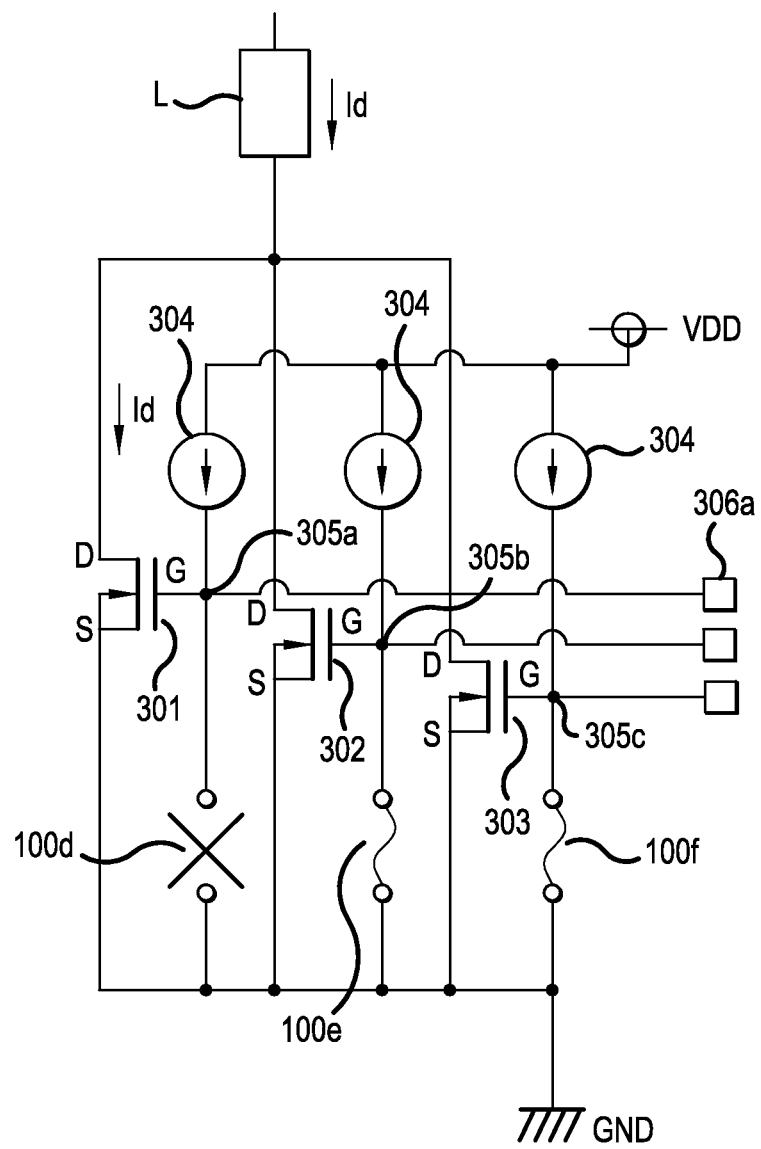
FIG. 7 is a circuit diagram of a main portion used for optimizing a drain current Id of a MOSFET 301.
Figure 8:
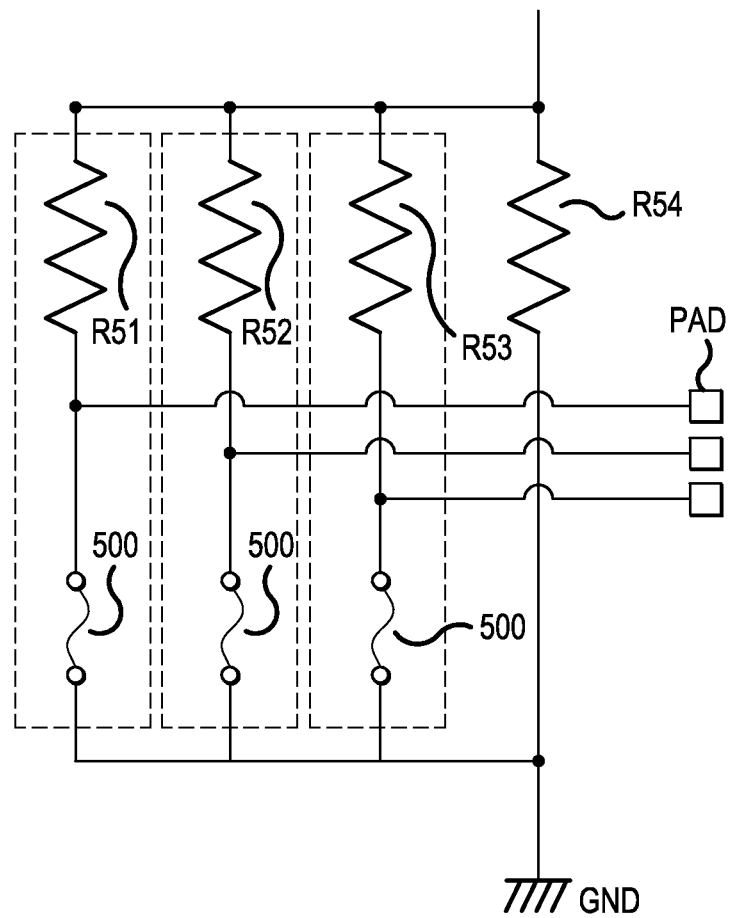
FIG. 8 is a circuit diagram of a main portion that performs resistance adjustment using a polysilicon fuse.
Figure 9A:
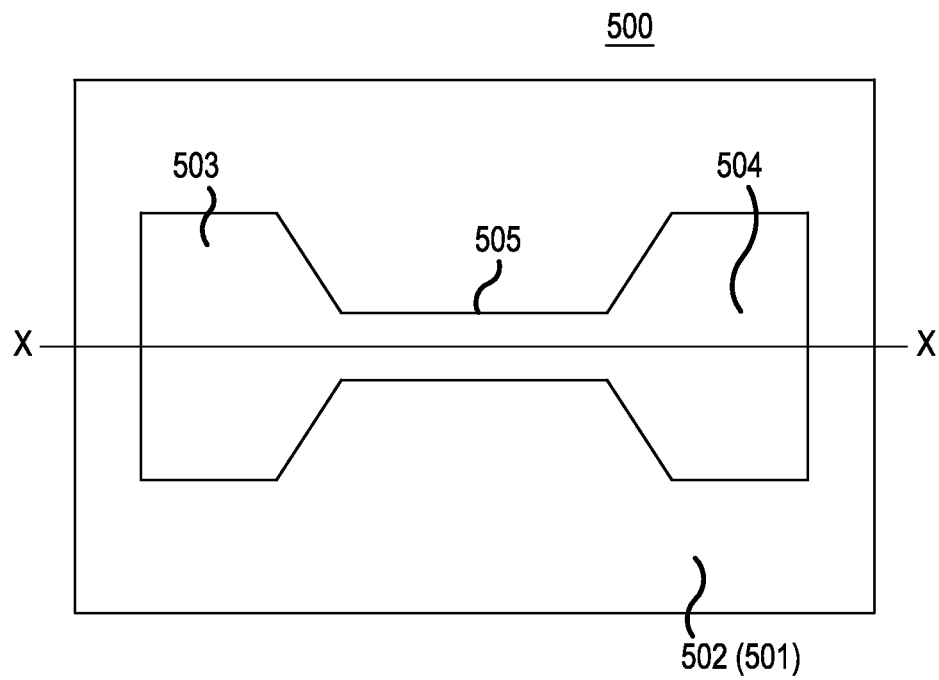
FIGS. 9A and 9B are diagrams that illustrate the configuration of a conventional lateral-type polysilicon fuse.
Figure 9B:
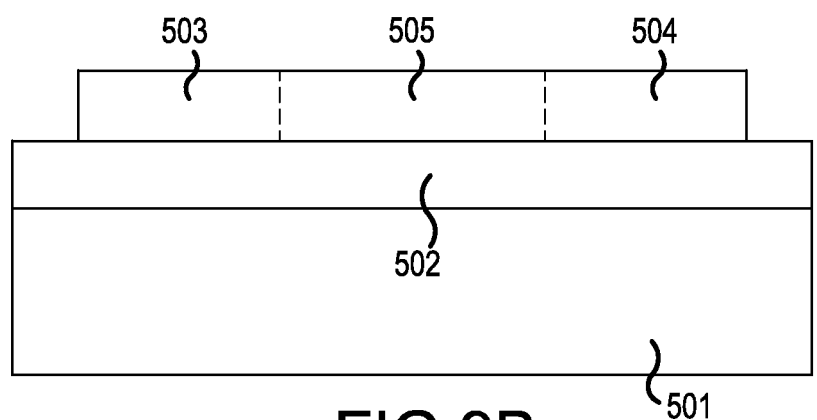

Next, a case will be described in which a drain current flowing through the MOSFET is optimized by using the polysilicon fuse. FIG. 7 is a circuit diagram of a main portion used for optimizing the drain current Id of an MOSFET 301. The drains D of three MOSFETs 301, 302, and 303 having mutually different sizes (having mutually-different conduction capabilities) are connected together and are connected to a load L. As the load L, there are a power supply circuit arranged inside a semiconductor integrated circuit not illustrated in the figure and the like. The sources S of the MOSFETs 301 to 303 are connected to ground GND. One end of a constant current source 304 is connected to the high electric potential side of a power supply VDD, and the other end of this constant current source 304 and one end of each of the polysilicon fuses 100d to 100f are connected together through the connection points 305a to 305c. The other end of each of the polysilicon fuses 100d to 100f is connected to the ground GND. The gates G of the MOSFETs 301 to 303 are connected to the connection points 305a to 305c.

Before the polysilicon fuses 100d to 100f are melted down, the gates G of all the MOSFETs 301 to 303 are pulled down to the ground GND so as to be in the turned-off state. For example, by applying a voltage to a pad 306a, the polysilicon fuse 100d connected to the MOSFET 301 that enables the optimal drain current Id to flow is melt down. The gate G of the MOSFET 301 is pulled up, and accordingly, the selected MOSFET 301 is in the turned on state, whereby the drain current Id that is optimal to the load L flows.

In this case, a high insulation property is required for the polysilicon fuse 100d. Thus, when the insulation property is lowered, there is a problem that the drain current Id flowing through the MOSFET 301 deviates from a set value.

As described above, according to the present invention, a polysilicon fuse having high reliability can be provided, and a polysilicon fuse capable of being reliably melted down even with a low voltage of about 5 V to 10 V is provided.

Thus, a polysilicon fuse has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

REFERENCE SYMBOLS

1 Lower layer wiring
1a and 6b Melted polysilicon
2 Lower part electrode
3 Interlayer insulating film
3a and 3b Insulating film
4 Opening portion
4a and 4e Side wall
4b and 16a Upper portion
4c and 16b Lower portion
5 Cavity
6 Polysilicon portion serving as melting portion
6a Surface of melted polysilicon
7 Upper layer wiring
7a Barrier metal
7b Wiring metal
8 Upper part electrode
10 Gap
11 Polysilicon
12 Resist mask
13 Mask
14 Insulating film of single layer
15 Ion
100 and 100a to 100g Polysilicon fuse
101 Semiconductor substrate
102 Insulating film
110 Resistor group
301 to 303 MOSFET
304 Constant current source
R1 to R4 Resistor

What is claimed is:

1. A polysilicon fuse comprising:
    a lower part electrode;
    an interlayer insulating film that is arranged on the lower part electrode;
    an opening portion in the interlayer insulating film that reaches the lower part electrode;
    a polysilicon portion, which serves as a melting portion, that is arranged inside the opening portion and includes a cavity; and
    an upper part electrode that is arranged on the interlayer insulating film so as to contact with the polysilicon portion.

2. The polysilicon fuse according to claim 1, wherein the opening portion includes an area having a reversely tapered shape in which an opening area increases as the depth increases.

3. The polysilicon fuse according to claim 1, wherein the lower part electrode is formed of a polysilicon film, and the upper part electrode is formed of a metal film.

4. The polysilicon fuse according to claim 1, wherein the lower part electrode is a part of a lower layer wiring, and the upper part electrode is a part of an upper layer wiring.

5. The polysilicon fuse according to claim 1, wherein a gap is formed between an upper face of the melted polysilicon and the upper part electrode when the melting portion is melted, and the upper part electrode and the lower part electrode are electrically insulated from each other.

6. The polysilicon fuse according to claim 1, wherein the interlayer insulating film is formed of at least two layers or more, and an etching rate of an upper layer of the two layers is lower than an etching rate of a lower layer.

7. A method of manufacturing a polysilicon fuse, the method comprising:
    forming a lower part electrode and a lower layer wiring by forming a polysilicon film on an insulating film and patterning the polysilicon film;
    forming an interlayer insulating film on the lower part electrode and the insulating film;
    forming an opening portion through the interlayer insulating film, to reach the lower part electrode;
    forming a second polysilicon film of a melting portion by depositing polysilicon into the opening portion so as to occupy an upper portion of the opening portion, and to have a cavity inside the second polysilicon film inside the opening portion, and removing the second polysilicon film until the interlayer insulating film is exposed; and
    forming an upper part electrode that is a metal film on the interlayer insulating film so as to contact the second polysilicon film filling the opening portion.

8. The method according to claim 7, wherein a side wall of the opening portion of the interlayer insulating film is formed in a reversely tapered shape.

9. The method according to claim 7, wherein a side wall of the opening portion having a reversely tapered shape is formed by using an interlayer insulating film having an upper and a lower layer, in which the upper layer has a lower etching rate than the lower layer.

10. A semiconductor device comprising:
an integrated circuit; and
a polysilicon fuse comprising:
a lower part electrode;
an interlayer insulating film that is arranged on the lower part electrode;
an opening portion in the interlayer insulating film that reaches the lower part electrode;
a polysilicon portion, which serves as a melting portion, that is arranged inside the opening portion and includes a cavity; and
an upper part electrode that is arranged on the interlayer insulating film so as to contact with the polysilicon portion.

\* \* \* \* \*